United States Patent [19]

Suzuki et al.

[11] Patent Number: 4,809,224

[45] Date of Patent: Feb. 28, 1989

[54] READ ONLY MEMORY DEVICE WITH MEMORY CELLS EACH STORING ONE OF THREE STATES

[75] Inventors: Yasuo Suzuki, Yokohama; Yasuaki Suzuki; Hiroshi Hirao, both of Kawasaki, all of Japan

[73] Assignee: Fujitsu Limited, Kanagawa, Japan

[21] Appl. No.: 82,696

[22] Filed: Aug. 7, 1987

[30] Foreign Application Priority Data

Aug. 8, 1986 [JP] Japan ................... 61-185246

[51] Int. Cl.$^4$ .................. G11C 7/00; G11C 11/40
[52] U.S. Cl. .................... 365/94; 365/103; 365/104; 365/168; 365/189
[58] Field of Search ............... 365/45, 168, 94, 103, 365/189, 207, 208

[56] References Cited

U.S. PATENT DOCUMENTS

| Re. 32,401 | 4/1987 | Beilstein, Jr. et al. | 365/168 X |
|---|---|---|---|
| 4,404,655 | 9/1983 | Naiff | 365/168 X |
| 4,449,203 | 5/1984 | Adlhoch | 365/104 |
| 4,503,518 | 3/1985 | Iwahashi | 365/104 |
| 4,653,023 | 3/1987 | Suzuki et al. | 365/104 |

FOREIGN PATENT DOCUMENTS 61-183329  8/1986  Japan .

OTHER PUBLICATIONS

IEEE Journal of Solid-State Circuits, vol. SC-16, No. 5, pp. 522, 528 & 529, (Oct. 1981).

Primary Examiner—Stuart N. Hecker
Assistant Examiner—Alyssa H. Bowler
Attorney, Agent, or Firm—Armstrong, Nikaido, Marmelstein & Kubovcik

[57] ABSTRACT

A ROM device includes a plurality of memory cells each storing one of three states, a cell voltage generating circuit for providing a cell voltage corresponding to the state stored in a selected one of the memory cells, and a reference cell for providing a reference voltage which is substantially the same as the cell voltage provided by a memory cell storing an intermediate state of the three states. The ROM also includes a comparator circuit for generating a logical output signal based on the result of a comparison between the cell voltage and the reference voltage.

5 Claims, 7 Drawing Sheets

| | POTENTIAL OF N3 | POTENTIAL OF N4 | STATE OF Q3 | STATE OF Q4 | POTENTIAL OF N1 | POTENTIAL OF N2 |
|---|---|---|---|---|---|---|
| STATE-1 | $V_H$ ($V_H > V_R$) | $V_R$ | OFF | ON | HIGH ($\fallingdotseq V_{CC}$) | LOW ($\fallingdotseq V_R$) |
| STATE-2 | $V_R$ | $V_R$ | OFF | OFF | HIGH ($\fallingdotseq V_{CC}$) | HIGH ($\fallingdotseq V_{CC}$) |
| STATE-3 | $V_L$ ($V_L < V_R$) | $V_R$ | ON | OFF | LOW ($\fallingdotseq V_L$) | HIGH ($\fallingdotseq V_{CC}$) |

READ ONLY MEMORY DEVICE WITH MEMORY CELLS EACH STORING ONE OF THREE STATES

BACKGROUND OF THE INVENTION

1. Field of the Invention

The present invention relates to a read only memory (ROM) with memory cells each capable of storing one of three states.

2. Description of the Related Arts

To increase the degree of integration of an integrated circuit, attention has been paid to a memory cell which is called a multi-value levelsmemory cell. (See, for example, U.S. Pat. Nos. 4,449,203, 4,503,518, and IEEE Journal of Solid State Circuits, Vol. SC-16, No. 5, Pages 522–529). The storing of data into such a memory cell having multi- value levels is generally carried out by changing a mutual- conductance (transconductance) gm of the memory cell transistor. For example, gm of a memory cell transistor can be selected from three kinds of gm, i.e., gm(1), gm(2), and gm(3), which correspond to three kinds of states: state-1, state-2, and state-3, respectively.

In the prior art, the discrimination of these three kinds of gm is carried out by providing a first reference transistor having a gm which is at an intermediate value between state-1 and state-2, and a second reference transistor having a gm which is at an intermediate value between state-2 and state-3, and comparing the output from the reference transistors with the output from the memory cells. In this case, problems arise in that it is difficult to further enhance the precision in manufacturing of a reference transistor, and the circuit construction of the ROM device is relatively complicated. Accordingly, the degree of integration of the ROM device cannot be easily increased.

SUMMARY OF THE INVENTION

It is an object of the present invention to provide an improved ROM in which the number of memory cells and reference transistors are reduced, the circuit construction of the ROM device is simplified, and the degree of integration of the ROM device is increased.

It is another object of the present invention to carry out a correct reading of information stored in the memory cells in such a ROM device.

According to the present invention, there is provided a read only memory with memory cells each having three value levels including a plurality of memory cell transistors for storing data, each of the transistors having three value levels; a reference transistor for providing a reference voltage level; a cell level voltage generating circuit selectively connected with the cell transistors; a reference voltage level generating circuit connected with the reference transistor; and a comparator circuit for comparing the output voltages of the cell level voltage generating circuit and the reference voltage level generating circuit to produce logical combinations of the potentials of predetermined nodes in the comparator circuit. The states for the three value levels of the cell transistors are determined on the basis of the produced logical combination of potentials.

DESCRIPTION OF THE PREFERRED EMBODIMENTS

Figure 1:
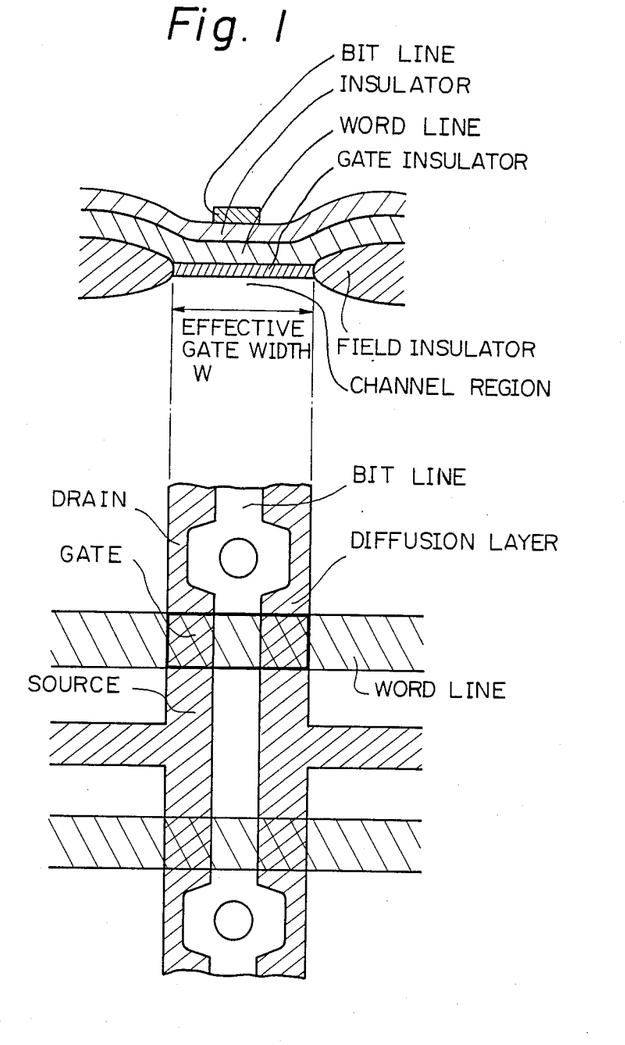
FIG. 1 shows an arrangement of a field effect transistor used for a read only memory according to the present invention.

Before describing the preferred embodiments of the present invention, a pattern of the integrated circuit used for a ROM according to the present invention is described with reference to FIG. 1, and the characteristic concerning the effective width of a gate of a memory cell for the ROM is described with reference to FIG. 2. As shown in FIG. 1, the pattern of an integrated circuit of the memory cells comprises diffusion layers in a semiconductor substrate, bit lines of, for example, aluminum, and word lines of, for example, polycrystalline silicon. A field effect transistor is formed at an overlapping portion of the diffusion layer and the word line, and a gate is defined by the area of the intersection between the diffusion layer and the word line. The effective width W of the gate is the length W of the gate along the longitudinal direction of the word line.

Figure 2:
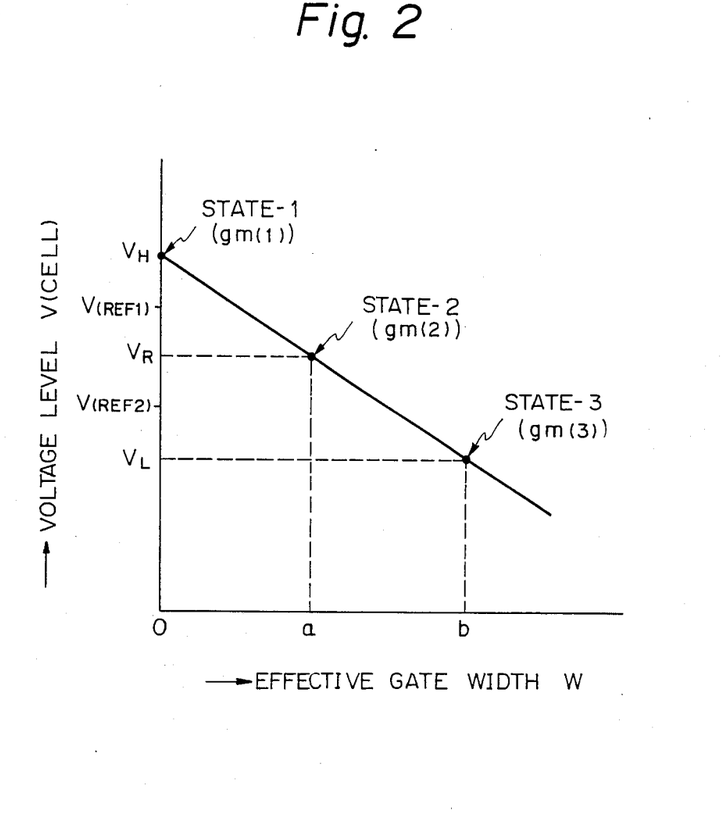
FIG. 2 shows characteristic of the field effect transistor in correspondence with the width of the gate.

The relationship between the effective width W of the gate and the voltage level V(CELL) is illustrated in FIG. 2. In correspondence with effective widths 0, a, and b of the gate, three states: STATE-1, STATE-2, and STATE-3 corresponding to three values of gm: gm(1), gm(2), and gm(3), respectively, are defined. A higher voltage level $V_H$ is realized by STATE-1 with gm(1), an intermediate voltage level $V_R$ is realized by STATE-2 with gm(2), and a lower voltage level $V_L$ is realized by STATE-3 with gm(3).

In connection with FIG. 2, it may be considered that reference voltages V(REF1) and V(REF2) are preselected, and by using these reference voltages, the detection of STATE-1, STATE-2, and STATE-3 is carried out. However, in such a case, a problem arises in that reference cell transistors are needed for producing the reference voltages V(REF1) and V(REF2). In the ROM according to the present invention, the need for such reference cell transistors is obviated.

Figure 3:
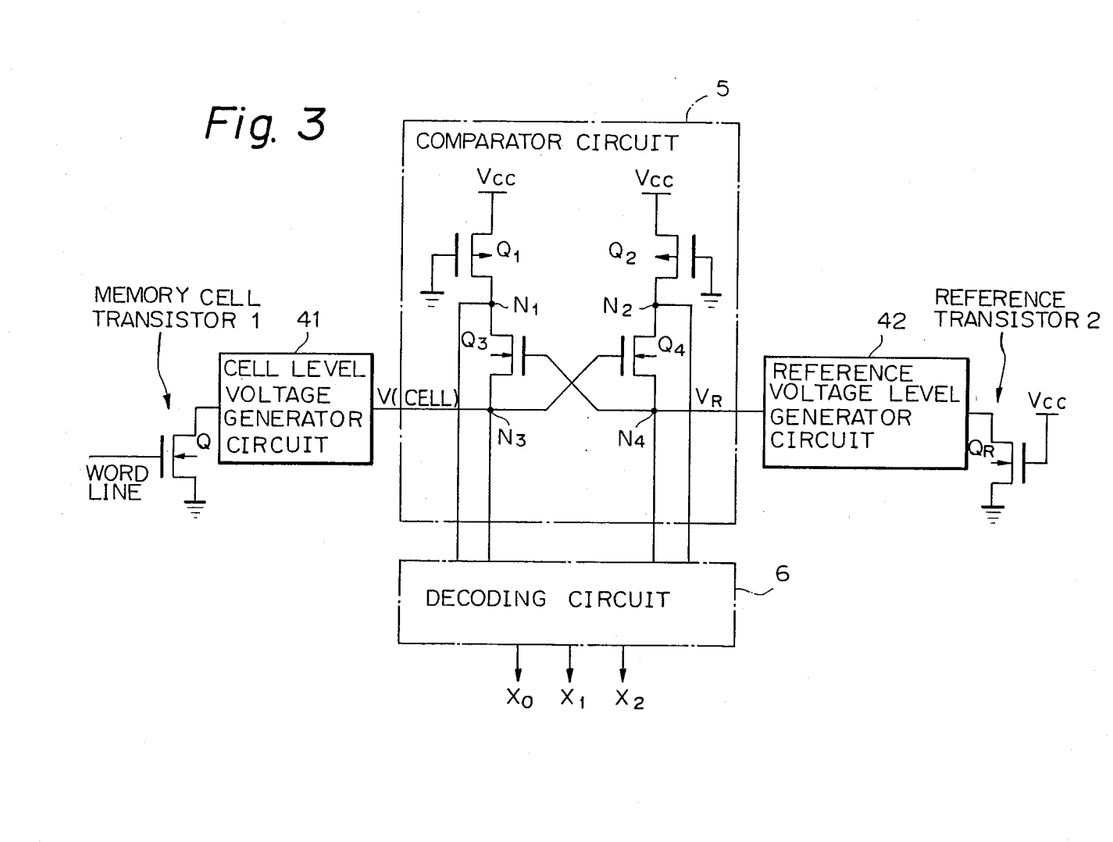
FIG. 3 is a diagram of the arrangement of a fundamental structure of the read only memory according to the present invention.

The basic structure of the circuit for the ROM with memory cells having three value levels, according to the present invention, is illustrated in FIG. 3. In the circuit shown in FIG. 3, there are provided a memory cell transistor(Q), a reference transistor($Q_R$), a cell level voltage generator circuit 41, a reference voltage level generator circuit 42, a comparator circuit 5, and a decoding circuit 6.

The gm of the memory cell transistor Q is one of gm(1), gm(2), and gm(3). The gm of the reference transistor $Q_R$ is gm(2). The cell level voltage generator circuit 41 converts the output of the memory cell transistor 1 into the voltage V(CELL), and the reference voltage level generator circuit 42 converts the output of the reference transistor 2 into the reference voltage $V_R$. The voltages V(CELL) and $V_R$ are supplied to a comparator circuit 5. In the comparator circuit 5, a switching transistor $Q_3$ is connected between a load transistor $Q_1$ and the cell level voltage generator circuit 41, and a switching transistor $Q_4$ is connected between a load transistor $Q_2$ and the reference voltage level generator circuit 42.

The transistors $Q_1$ and $Q_2$ are p-channel type, but drain-gate connected n-channel enhancement type transistors can be used as transistors $Q_1$ and $Q_2$. Further, source-gate connected n-channel depletion type transistors can be used as the transistors $Q_1$ and $Q_2$.

The switching transistors $Q_3$ and $Q_4$ are n-channel type transistors each having a threshold voltage of, for example, 0.5 volt. The switching transistor $Q_3$ is controlled by the $V_R$ delivered from the reference voltage level generator circuit 42, and the switching transistor $Q_4$ is controlled by the V(CELL) delivered from the cell level voltage generator circuit 41. The state of the memory cell transistor Q, i.e., the gm of the memory cell transistor Q, is discriminated from the logic relationships of the potentials of nodes $N_1$ and $N_2$ of the switching transistors $Q_3$ and $Q_4$.

Figure 4:
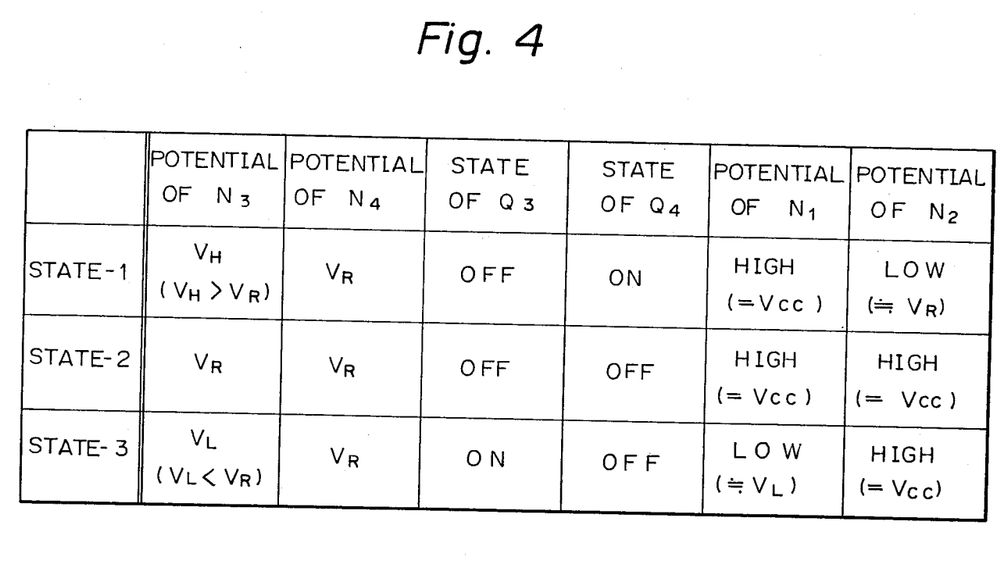
FIG. 4 illustrates the relationships of the potentials of nodes with respect to the states of the memory cell transistor.

This logical relationship is shown in FIG. 4. In STATE-1, the potentials of $N_3$ and $N_4$ are $V_H$ and $V_R$, respectively, where $V_H$ is higher than $V_R$, the states of $Q_3$ and $Q_4$ are OFF and ON, respectively, and the potentials of $N_1$ and $N_2$ are HIGH and LOW, respectively, where HIGH is $V_{CC}$ and LOW is approximately $V_R$. In STATE-2, the potentials of $N_3$ and $N_4$ are both $V_R$, the states of $Q_3$ and $Q_4$ are both OFF, and the potentials of $N_1$ and $N_2$ are both HIGH, where HIGH is $V_{CC}$. In STATE-3, the potentials of $N_3$ and $N_4$ are $V_L$ and $V_R$, respectively, where $V_L$ is lower than $V_R$, the states of $Q_3$ and $Q_4$ are ON and OFF, respectively, and the potentials of $N_1$ and $N_2$ are LOW and HIGH, respectively, where LOW is approximately $V_L$ and HIGH is $V_{CC}$.

According to the logical relationship shown in FIG. 4, the discrimination between STATE-1, STATE-2, and STATE-3 can be based on the logical relationship between the potentials of the nodes $N_1$ and $N_2$.

Further, based on the extended logical relationship between the potentials of the nodes $N_1$, $N_2$, $N_3$, and $N_4$, a more reliable discrimination between STATE-1, STATE-2, and STATE-3 can be obtained.

Figure 5:
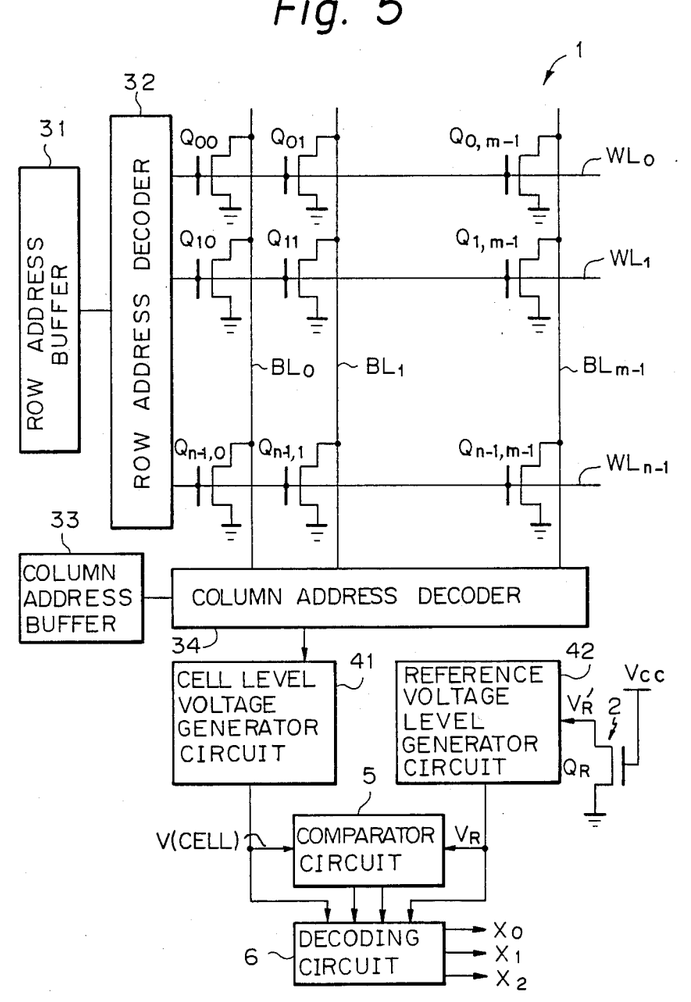
FIG. 5 is a diagram of a read only memory according to an embodiment of the present invention.

A ROM with memory cells each having three value levels according to an embodiment of the present invention is shown in FIG. 5. The ROM of FIG. 5 includes a memory cell array 1 having memory cells $Q_{00}$, $Q_{01}$, ... $Q_{0,m-1}$, ... $Q_{n-1,m-1}$, bit lines $BL_0$, $BL_1$, ... $BL_{m-1}$, word lines $WL_0$, $WL_1$, . . . $WL_{n-1}$ a reference transistor 2, a row address buffer 31, a row address decoder 32, a column address buffer 33, a column address decoder 34, a cell level voltage generator circuit 41, a reference voltage level generator circuit 42, a comparator circuit (sense amplifier circuit) 5, and a decoding circuit 6. The memory cell transistor(Q) in the circuit of FIG. 3 represents one of the memory cell transistors ($Q_{00}$, $Q_{01}$, . . . $Q_{0,m-1}$, . . . $Q_{n-1,m-1}$ in FIG. 5, and the reference transistor($Q_R$) in the circuit of FIG. 3 represents the reference transistor 2 in FIG. 5.

A selection from the word lines $WL_0$, $WL_1$ . . . $WL_{n-1}$ is carried out by the row address decoder 32, which receives the row address signal from the row address buffer 31, and a selection from the bit lines $BL_0$, $BL_1$, . . . $BL_{m-1}$ is carried out by the column address decoder 34, which receives the column address signal from the column address buffer 33.

The n-channel enhancement field effect type memory cell transistors $Q_{00}$, $Q_{01}$, ... $Q_{0,m-1}$, ... $Q_{n-1,m-1}$ are arranged at intersections between the bit lines $BL_0$, $BL_1$, ... $BL_{m-1}$ and the word lines $WL_0$, $WL_1$, ... $WL_{n-1}$. Each of the memory cell transistors has one of the three gm values; gm(1), gm(2), and gm(3). The designation of one of the three gm values, i.e., the storing of data into the memory cell transistor, is carried out by selecting the value of the effective width W of the memory cell transistor. This selection of the value of the effective width W can be made, for example, by changing the amount of doping of the impurities, such as boron, arsenic, phosphor, and the like, directly underneath the gate of the memory cell transistor.

As an example, if the word line $WL_0$ is selected by the row address decoder 32 and the bit line $BL_0$ is selected by the column address decoder 34, the memory cell transistor $Q_{00}$ is selected, and accordingly, a current flows via the cell level voltage generator circuit 41 through the memory cell transistor $Q_{00}$.

Accordingly, the potential of the bit line $BL_0$, which corresponds to the gm value of the memory cell transistor $Q_{00}$, is supplied as a voltage V(CELL) to the comparator 5.

The gm of the reference transistor $Q_R$ is adjusted to the value gm(2), and the voltage $V_R$ delivered from the reference voltage level generator circuit 42 connected to the reference transistor $Q_R$ is supplied to the comparator circuit 5.

The output V(CELL) of the cell level voltage generator circuit 41 and the output $V_R$ of the reference voltage level generator circuit 42 are also supplied to the decoding circuit 6. The output signals of the comparator circuit 5 are supplied to the decoding circuit 6.

In the decoding circuit 6, a discrimination between STATE-1, STATE-2, and STATE-3 is carried out in accordance with the voltages V(CELL) and $V_R$, and based on this discrimination, three output signals $X_0$, $X_1$, and $X_2$ are delivered.

The output signals "$X_0=1$, $X_1=0$, $X_2=0$" represent STATE-1, the output signals 1 "$X_0=0$ $X_1=1$, $X_2=0$" represent STATE-2, and the output signals "$X_0=0$, $X_1=0$, $X_2=1$" represent STATE-3.

Figure 6:
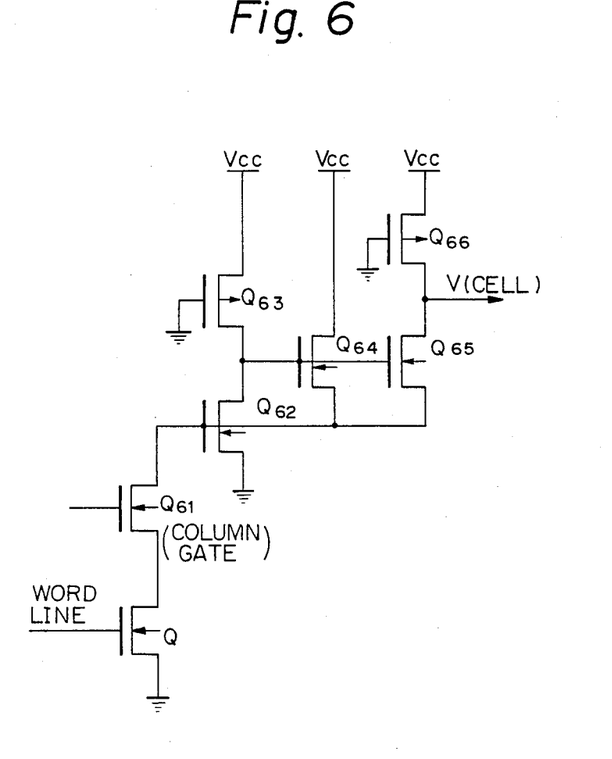
FIG. 6 shows an example of the structure of the cell level voltage generating circuit.
Figure 7:
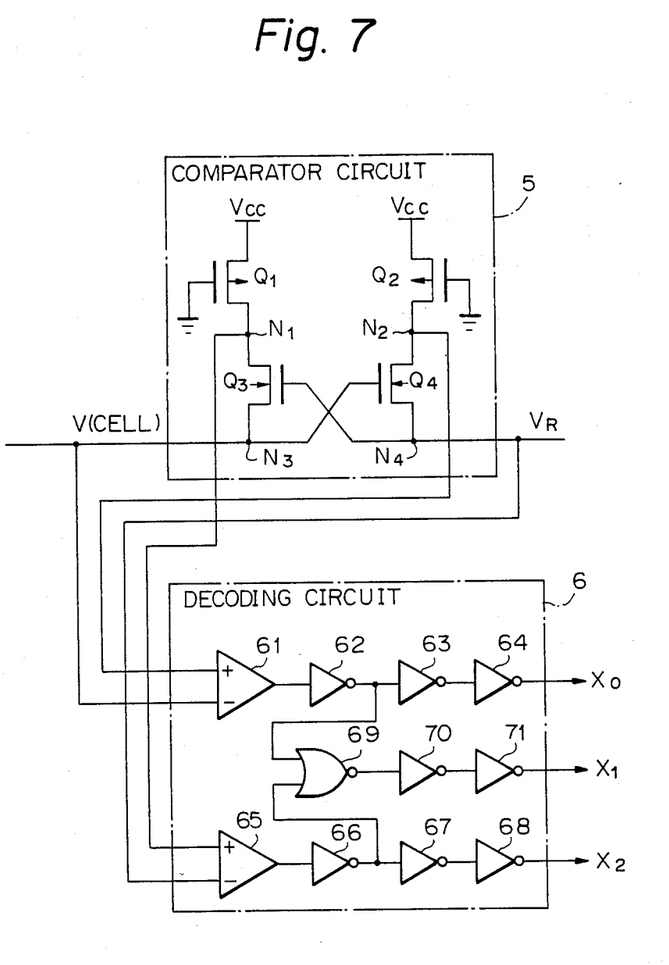
FIG. 7 shows an example of the structure of a decoder used in a read only memory according to the present invention.

An example of the structure of the cell level voltage generator circuit 41 in FIG. 5 is shown in FIG. 6, and an example of the structure of the decoding circuit 6 in FIG. 5 is shown in FIG. 7. As shown in FIG. 6, the cell level voltage generator circuit 41 includes a memory cell transistor Q, a column gate transistor $Q_{61}$, and a level converting circuit constituted by transistors $Q_{62}$ to $Q_{66}$. As shown in FIG. 7, the decoding circuit 6 includes a differential amplifier 61, inverters 62, 63, and 64, a NOR gate 69, inverters 70 and 71, a differential amplifier 65, and inverters 66, 67, and 68.

The differential amplifier 61 receives the voltage of node $N_2$ as the first input and the voltage of node $N_3$, which is V(CELL), as the second input. The differential amplifier 65 receives the voltage of node $N_1$ as the first input and the voltage of node $N_4$, which is $V_R$, as the second input.

The differential amplifier 61, and inverters 62, 63, and 64 are connected in series to produce an output signal $X_0$. The NOR gate 69 receives the outputs of the inverters 62 and 66, and the NOR gate 69 and the inverters 70 and 71 are connected in series to produce an output signal $X_1$. The differential amplifier 65, and the inverters 66, 67, and 68 are connected in series to produce an output signal $X_2$.

Where the memory cell transistor is in STATE-1, the potential of node $N_3$ is HIGH, i.e., $V_H$, the potential of node $N_2$ is LOW, and thus the potential of the output of the differential amplifier 61 is LOW. Accordingly, the potential of the output of the inverter 64 is HIGH. Therefore, the output $X_0$ is "1". In this case, the potential of node $N_1$ is HIGH with respect to the voltage $V_R$, which is the output voltage of the reference voltage level generator circuit 42. Therefore, the potential of the output of the differential amplifier 65 is HIGH, and accordingly, the potential of the inverter 68 is LOW. Therefore, the output $X_2$ is "0". In this case, the potential of the output of the NOR gate 69 is LOW, and thus the potential of the output of the inverter 71 is LOW. Therefore, the output $X_1$ is "0". In consequence, the outputs "$X_0$, $X_1$, $X_2$" are "1, 0, 0", respectively.

Where the memory cell transistor is in STATE-2, the potential of node $N_3$ is $V_R$, the potential of node $N_2$ is HIGH, i.e., $V_{CC}$ and thus the potential of the output of the differential amplifier 61 is HIGH. Accordingly, the potential of the output of the inverter 64 is LOW. Therefore, the output $X_0$ is "0". In this case, the potential of the output of the differential amplifier 65 is HIGH, and thus the potential of the output of the inverter 68 is LOW. Therefore, the output $X_2$ is "0". Accordingly, the potentials of the outputs of the inverters 62 and 66 are both "LOW", and thus the potential of the output of the NOR gate 69 is HIGH. Accordingly, the potential of the inverter 71 is HIGH, and therefore, the potential of the output $X_1$ of the inverter 71 is "1". In consequence, the outputs "$X_0$, $X_1$, $X_2$" are "0, 1, 0", respectively.

Where the memory cell transistor is in STATE-3, the potential of node $N_3$ is $V_L$, as a LOW level, the potential of node $N_2$ is $V_{CC}$, as a HIGH level, and thus the potential of the output of the differential amplifier 61 is HIGH. Accordingly, the potential of the output of the inverter 64 is LOW, and therefore, the output $X_0$ is "0". In this case, the potential of the node $N_1$ is LOW with respect to the potential $V_R$ of the node $N_4$, and thus the potential of the differential amplifier 65 is LOW, and accordingly, the potential of the output of the inverter 68 is HIGH. Therefore, the output $X_2$ is "1". In this case, the potential of the output of the inverter 66 is HIGH, and thus the potential of the output of the NOR gate 69 is LOW. Therefore, the output $X_1$ is "0". In consequence, the outputs "$X_0$, $X_1$, $X_2$" are "0, 0, 1", respectively.

Instead of the decoding circuit shown in FIG. 6, it is possible to construct a decoding circuit by a circuit for carrying out a logical combination of the potentials of only the nodes $N_1$ and $N_2$.

We claim:

1. A read only memory device comprising:
 a plurality of memory cells each storing one of three states;
 a cell voltage generating circuit connected to said plurality of memory cells for providing a cell voltage corresponding to the state stored in a selected one of said plurality of memory cells;
 a reference cell provided for said plurality of memory cells for providing a reference voltage which is substantially the same as the cell voltage provided by a memory cell storing an intermediate state of the three states; and
 a comparator circuit connected to said cell voltage generating circuit and said reference cell for generating a logical output signal based on the result of a comparison between the cell voltage and the reference voltage.

2. A read only memory device according to claim 1, wherein said memory cells comprise memory cell transistors, and said three states of said memory cells transistors are realized by changing the effective gate width of said memory cell transistors.

3. A read only memory according to claim 1, wherein said comparator circuit comprises:
 a first load transistor and a second load transistor each connected to a voltage source;
 a first switching transistor connected between said first load transistor and said cell level voltage generating circuit and controlled by said reference voltage; and
 a second switching transistor connected to said second load transistor and controlled by the cell voltage.

4. A read only memory according to claim 1, further comprising a decoding circuit connected to said cell level voltage generator circuit, said reference cell, and said comparator circuit for producing decoder output signals corresponding to three states stored in said memory cells.

5. A memory cell according to claim 4, wherein said decoding circuit is constituted by a combination of differential amplifiers, inverters, and a NOR gate.

* * * * *